(12) United States Patent
Kumazawa (10) Patent No.: US 12,126,330 B2
(45) Date of Patent: Oct. 22, 2024

(54) SEMICONDUCTOR DEVICE (71) Applicant: FUJI ELECTRIC CO., LTD., Kawasaki (JP)

(72) Inventor: Yuki Kumazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 21 days.

(21) Appl. No.: 18/193,178

(22) Filed: Mar. 30, 2023

(65) Prior Publication Data

US 2023/0378951 A1 Nov. 23, 2023

(30) Foreign Application Priority Data

May 17, 2022 (JP) .................. 2022-080556

(51) Int. Cl.
*H03K 17/0812* (2006.01)
*H03K 17/14* (2006.01)
*H03K 17/28* (2006.01)
*H03K 17/08* (2006.01)

(52) U.S. Cl.
CPC ....... *H03K 17/14* (2013.01); *H03K 17/08126* (2013.01); *H03K 17/28* (2013.01); *H03K 2017/0806* (2013.01)

(58) Field of Classification Search
CPC ......... H03K 17/0812; H03K 17/08126; H03K 17/08128; H03K 17/14; H03K 17/28; H03K 2017/0806

USPC ................ 327/378, 512, 513, 574
See application file for complete search history.

(56) References Cited

U.S. PATENT DOCUMENTS

2016/0141284 A1  5/2016 Ishihara et al.
2023/0223867 A1* 7/2023 Wada .................. H02M 1/0009
                                                363/97

FOREIGN PATENT DOCUMENTS

JP    2021-185730 A    12/2021
WO    2015/025422 A1   2/2015

* cited by examiner

*Primary Examiner* — William Hernandez
(74) *Attorney, Agent, or Firm* — RABIN & BERDO, P.C.

(57) ABSTRACT

A semiconductor device having a semiconductor chip and a control circuit. The semiconductor chip has a gate electrode pad connected to the gate of an output element and the gate of a current monitor element, a sense emitter electrode pad connected to the sense emitter of the current monitor element and to the anode of the temperature detection diode via a current limiting element, and a cathode electrode pad that is connected to the cathode of the temperature detection diode, the cathode being grounded without being connected to the emitter of the output element. In a temperature detection mode, the control circuit receives a temperature detection voltage via the sense emitter electrode pad and detects the temperature state of the output element. In a current detection mode, the control circuit receives a sense current via the sense emitter electrode pad and detects the current state of the output element.

12 Claims, 12 Drawing Sheets

SEMICONDUCTOR DEVICE

CROSS-REFERENCE TO RELATED APPLICATION

This application is based upon and claims the benefit of priority of the prior Japanese Patent Application No. 2022-080556, filed on May 17, 2022, the entire contents of which are incorporated herein by reference.

BACKGROUND OF THE INVENTION

1. Field of the Invention

The embodiment discussed herein relates to a semiconductor device having semiconductor chips.

2. Background of the Related Art

Semiconductor devices called intelligent power modules (IPMs) have been developed, in which power semiconductor elements such as insulated gate bipolar transistors (IGBTs), drive circuits for driving the power semiconductor elements, and others are built.

For example, IPMs are widely used in vehicle electrical systems and the like that supply power to motors, inverters, converters, and others, and products that achieve size reduction, high performance, and high reliability have been desired.

In addition, IPMs have a protection function of monitoring a current flowing through a power semiconductor element, the temperature of the power semiconductor element, and others and protecting the power semiconductor element on the basis of the monitoring results so as not to damage the power semiconductor element.

Figure 11:
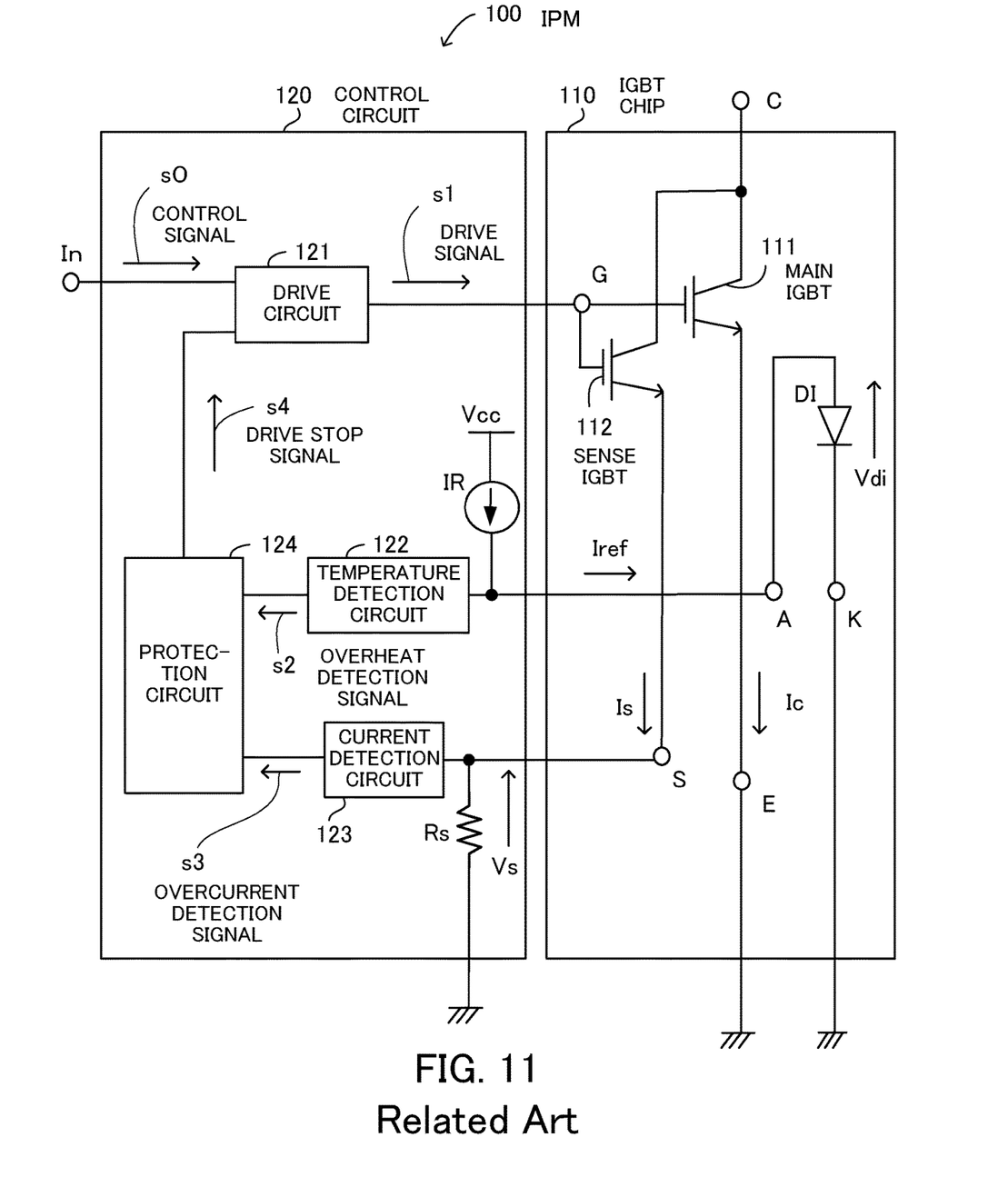
FIG. 11 illustrates an example of the configuration of a conventional intelligent power module (IPM)

FIG. 11 is an example of the configuration of a conventional IPM. The IPM 100 includes an IGBT chip 110 and a control circuit 120. The IGBT chip 110 includes a main IGBT 111, a sense IGBT 112, and a temperature detection diode DI. The control circuit 120 includes a drive circuit 121, a temperature detection circuit 122, a current detection circuit 123, a protection circuit 124, a constant current source IR, and a sense resistor Rs (with a resistance of several Ω to several kΩ).

In the IGBT chip 110, the main IGBT 111 is a power semiconductor element that performs switching with a drive signal s1 to operate a load. In this connection, the load, not illustrated, is connectable between the emitter of the main IGBT 111 and the ground (GND). The sense IGBT 112 is a current sense power semiconductor element that flows a sense current Is (for example, a current that is 1-10,000th a collector current Ic) that is proportional to the collector current Ic flowing through the main IGBT 111. In addition, the temperature detection diode DI is provided in the vicinity of the main IGBT 111 as an element of detecting the temperature of the main IGBT 111.

In addition, the IGBT chip 110 has a collector electrode pad C, a gate electrode pad G, an emitter electrode pad E, a sense emitter electrode pad S, an anode electrode pad A, and a cathode electrode pad K as electrode pads that are connectable to predetermined devices (control circuit 120, load, power supply, and others).

The collector electrode pad C is connected to the collector of the main IGBT 111 and the collector of the sense IGBT 112. The gate electrode pad G is connected to the gate of the main IGBT 111, the gate of the sense IGBT 112, and the output terminal of the drive circuit 121. The emitter electrode pad E is connected to the emitter of the main IGBT 111 and GND. The sense emitter electrode pad S is connected to the sense emitter of the sense IGBT 112, the input terminal of the current detection circuit 123, and one terminal of the sense resistor Rs.

The anode electrode pad A is connected to the anode of the temperature detection diode DI, the input terminal of the temperature detection circuit 122, and the output terminal of the constant current source IR. The cathode electrode pad K is connected to the cathode of the temperature detection diode DI and GND.

In the control circuit 120, the drive circuit 121 generates the drive signal s1 for driving the main IGBT 111, on the basis of a control signal s0 received via an input terminal In. The constant current source IR is applied with a voltage Vcc, and then outputs a current Iref.

The temperature detection circuit 122 detects an overheat state of the main IGBT 111. In this case, a potential that is generated when the current Iref output from the constant current source IR flows through the temperature detection diode DI is supplied as a temperature detection voltage Vdi to the temperature detection circuit 122 via the anode electrode pad A. The temperature detection circuit 122 detects the temperature state of the main IGBT 111 on the basis of the temperature detection voltage Vdi, and when detecting that the temperature state of the main IGBT 111 is an overheat state, outputs an overheat detection signal s2.

The current detection circuit 123 detects an overcurrent state of the main IGBT 111. In this case, when the main IGBT 111 is turned on according to the drive signal s1, the sense IGBT 112 is turned on accordingly, so that the sense current Is is output from the sense IGBT 112.

In addition, the sense current Is output from the sense IGBT 112 is input to the control circuit 120 via the sense emitter electrode pad S. Then, a potential that is generated by the sense current Is flowing through the sense resistor Rs is supplied as a sense voltage Vs to the current detection circuit 123. The current detection circuit 123 detects the current state of the main IGBT 111 on the basis of the sense voltage Vs, and when detecting that the current state is an overcurrent state, outputs an overcurrent detection signal s3.

When receiving at least one of the overheat detection signal s2 and overcurrent detection signal s3, the protection circuit 124 outputs a drive stop signal s4 to the drive circuit 121. In response to the drive stop signal s4, the drive circuit 121 turns off the main IGBT 111 to stop the operation of the main IGBT 111.

As related art, there has been proposed a semiconductor device that has an external electrode that is connected in common to the emitter or source of a transistor and the cathode of a temperature detection diode (International Publication Pamphlet No. 2015/025422). In addition, there has been proposed a technique in which a diode that is connected to the source of a main control MOSFET and the source of a current MOSFET is provided, and when the main control MOSFET is in OFF state, a forward current is made to flow to the diode to measure the temperature on the basis of the anode potential (Japanese Laid-open Patent Publication No. 2021-185730).

Figure 12:
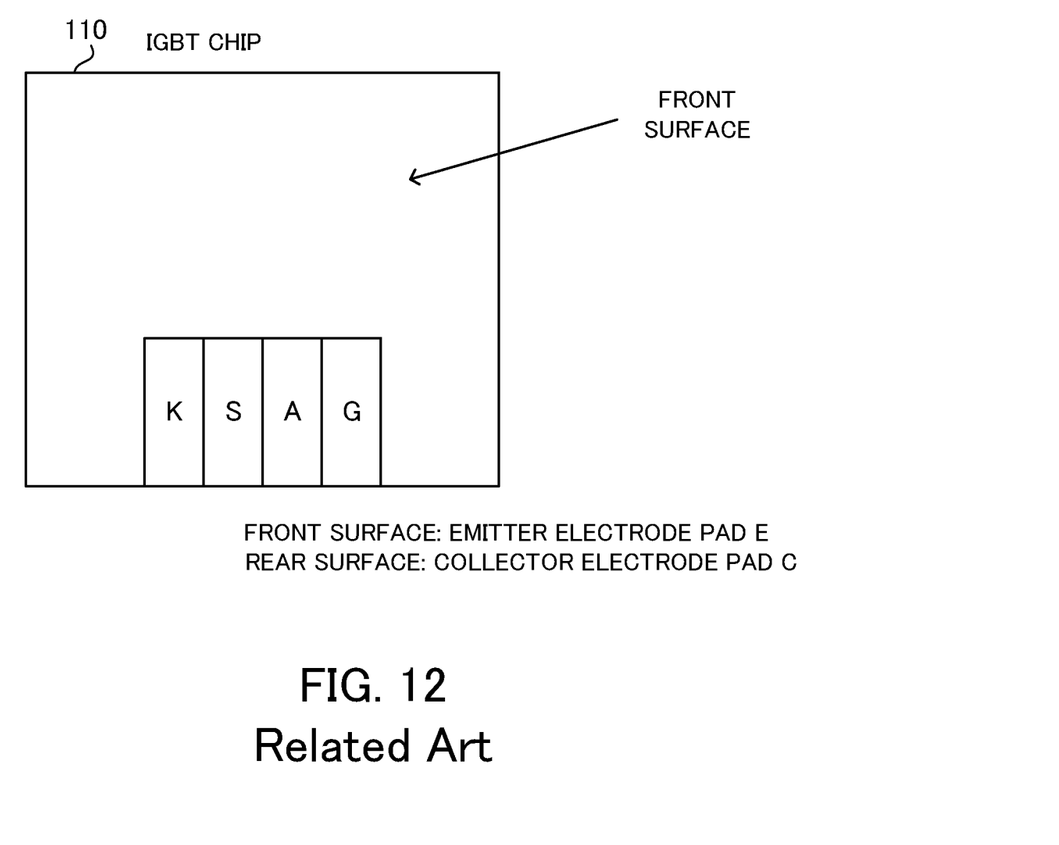
FIG. 12 illustrates electrode pads provided on a conventional IGBT chip.

FIG. 12 illustrates electrode pads provided on a conventional IGBT chip. The emitter electrode pad E is formed on the front surface of the IGBT chip 110, and the collector electrode pad C is formed on the rear surface of the IGBT chip 110. In addition, the cathode electrode pad K, sense emitter electrode pad S, anode electrode pad A, and gate electrode pad G are also formed on the front surface of the IGBT chip 110.

As described above, the IGBT chip 110 of the conventional IPM 100 has four electrode pads (K, S, A, and G) in addition to the emitter electrode pad E on the front surface of the IGBT chip 110.

However, in view of simplification of a chip manufacturing process, a reduction in chip size, and a reduction in the number of wires in wire bonding, it is desirable that a small number of electrode pads be formed on a semiconductor chip such as the IGBT chip 110, and products that achieve a reduction in the number of electrode pads have been desired.

SUMMARY OF THE INVENTION

According to one aspect, there is provided a semiconductor device for operating a load, including: a semiconductor chip, including an output element that receives a drive signal, to thereby perform switching to operate the load, the output element having a gate and an emitter, a current monitor element that monitors a current flowing through the output element, the current monitor element having a gate and a sense emitter, and a temperature detection element that detects a temperature of the output element, the temperature detection element having an anode and a cathode, the semiconductor chip further having: a first electrode pad connected to the gate of the output element and the gate of the current monitor element, a second electrode pad connected to the sense emitter of the current monitor element and to the anode of the temperature detection element via a current limiting element, and a third electrode pad connected to the cathode of the temperature detection element, which is grounded without being connected to the emitter of the output element; and a control circuit connected to the first electrode pad and the second electrode pad, the control circuit being configured to input the drive signal to the gate of the output element via the first electrode pad, operate in a temperature detection mode in response to the output element being turned off, the temperature detection mode being a mode in which the control circuit receives a temperature detection voltage output from the temperature detection element via the second electrode pad, and detects a temperature state of the output element, and operate in a current detection mode in response to the output element being turned on, the current detection mode being a mode in which the control circuit receives a sense current output from the current monitor element via the second electrode pad, and detects a current state of the output element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to the accompanying drawings. Note that the same reference numerals may be given to elements having substantially the same functions in the specification and drawings so as to omit the overlapping description.

Figure 1:
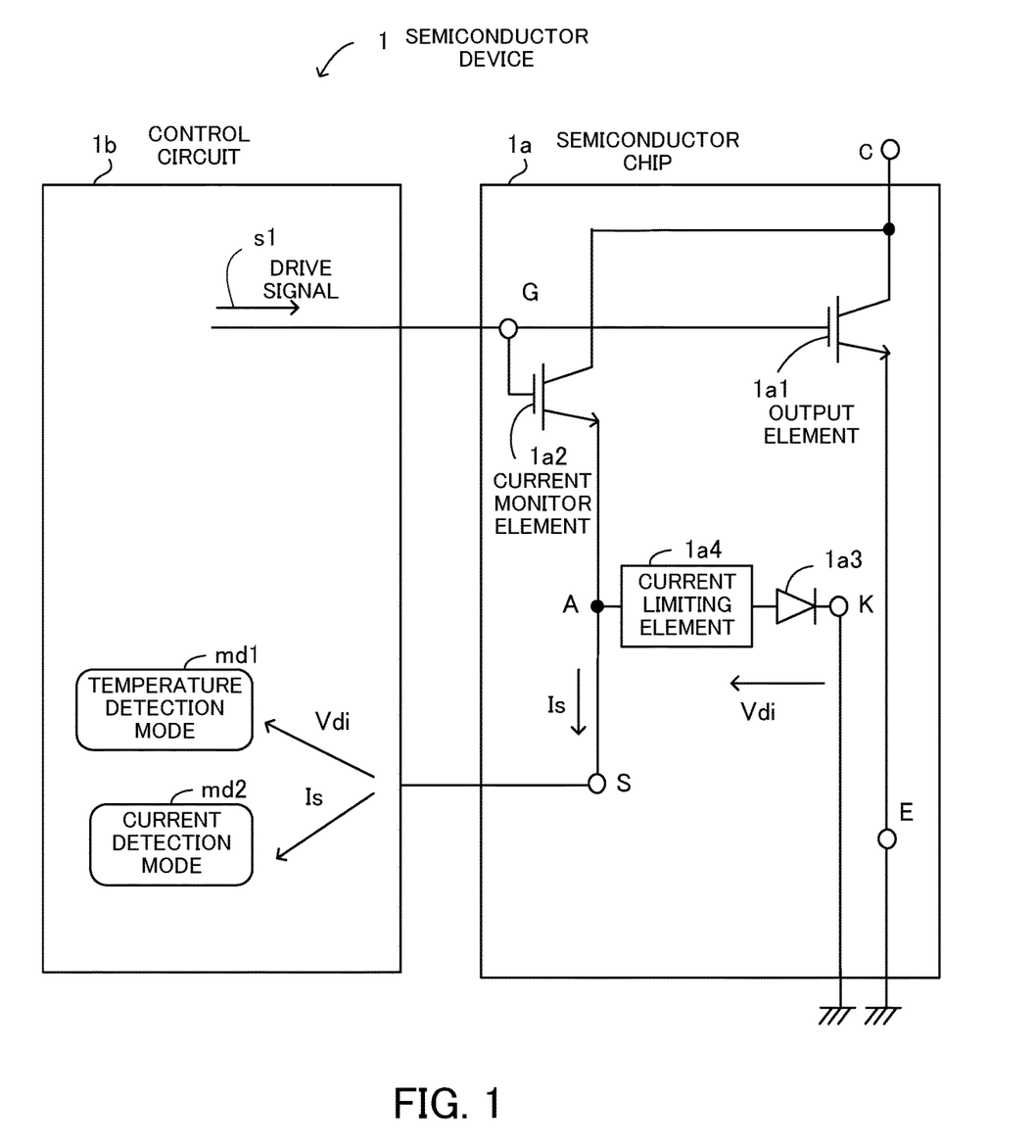
FIG. 1 is a view for describing an example of a semiconductor device.

FIG. 1 is a view for describing an example of a semiconductor device. The semiconductor device 1 includes a semiconductor chip 1a and a control circuit 1b. The semiconductor chip 1a includes an output element 1a1, a current monitor element 1a2, a temperature detection element (hereinafter, temperature detection diode) 1a3, and a current limiting element 1a4.

The output element 1a1 is a main insulated gate bipolar transistor (IGBT), for example. The current monitor element 1a2 is a sense IGBT, for example. The output element 1a1 performs switching with a drive signal s1 to operate a load. The current monitor element 1a2 monitors a current flowing through the output element 1a1. The temperature detection diode 1a3 detects the temperature of the output element 1a1.

In addition, the semiconductor chip 1a has a first electrode pad, a second electrode pad, and a third electrode pad. The first electrode pad is a gate electrode pad G that is connected to the gate of the output element 1a1 and the gate of the current monitor element 1a2.

The second electrode pad is a sense emitter electrode pad S that is connected to the sense emitter of the current monitor element 1a2, and to the anode of the temperature detection diode 1a3 via the current limiting element 1a4 (the function of the current limiting element 1a4 will be described in detail later).

The third electrode pad is a cathode electrode pad K that is connected to the cathode of the temperature detection diode 1a3 in a configuration where the cathode of the temperature detection diode 1a3 is grounded without being connected to the emitter of the output element 1a1.

In this connection, the semiconductor chip 1a additionally has a collector electrode pad C and an emitter electrode pad E. The collector electrode pad C is connected to the collector of the output element 1a1 and the collector of the current monitor element 1a2, and the emitter electrode pad E is connected to the emitter of the output element 1a1 and the ground (GND).

The control circuit 1b inputs the drive signal s1 to the gate of the output element 1a1 via the gate electrode pad G. Then, when the output element 1a1 is turned off, the control circuit 1b goes into a temperature detection mode md1, in which the control circuit 1b receives, via the sense emitter electrode pad S, a temperature detection voltage Vdi output from the temperature detection diode 1a3, and detects the temperature state of the output element 1a1.

When the output element 1a1 is turned on, the control circuit 1b goes into a current detection mode md2, in which the control circuit 1b receives, via the sense emitter electrode pad S, a sense current Is output from the current monitor element 1a2, and detects the current state of the output element 1a1.

As described above, in the semiconductor device 1, the control circuit 1b switches between the temperature detection mode md1 and the current detection mode md2 according to whether the output element 1a1 is turned on or off. With this approach, it is possible to configure the semiconductor chip 1a such that the sense emitter electrode pad S is also usable in common for the node A corresponding to an anode electrode pad (i.e., the conventional anode electrode pad A is eliminated). As a result, it is possible to reduce the number of electrode pads on the semiconductor chip 1a, as compared with the conventional configuration.

(Configuration of Semiconductor Device (with Elimination of Two Electrode Pads))

Figure 2:
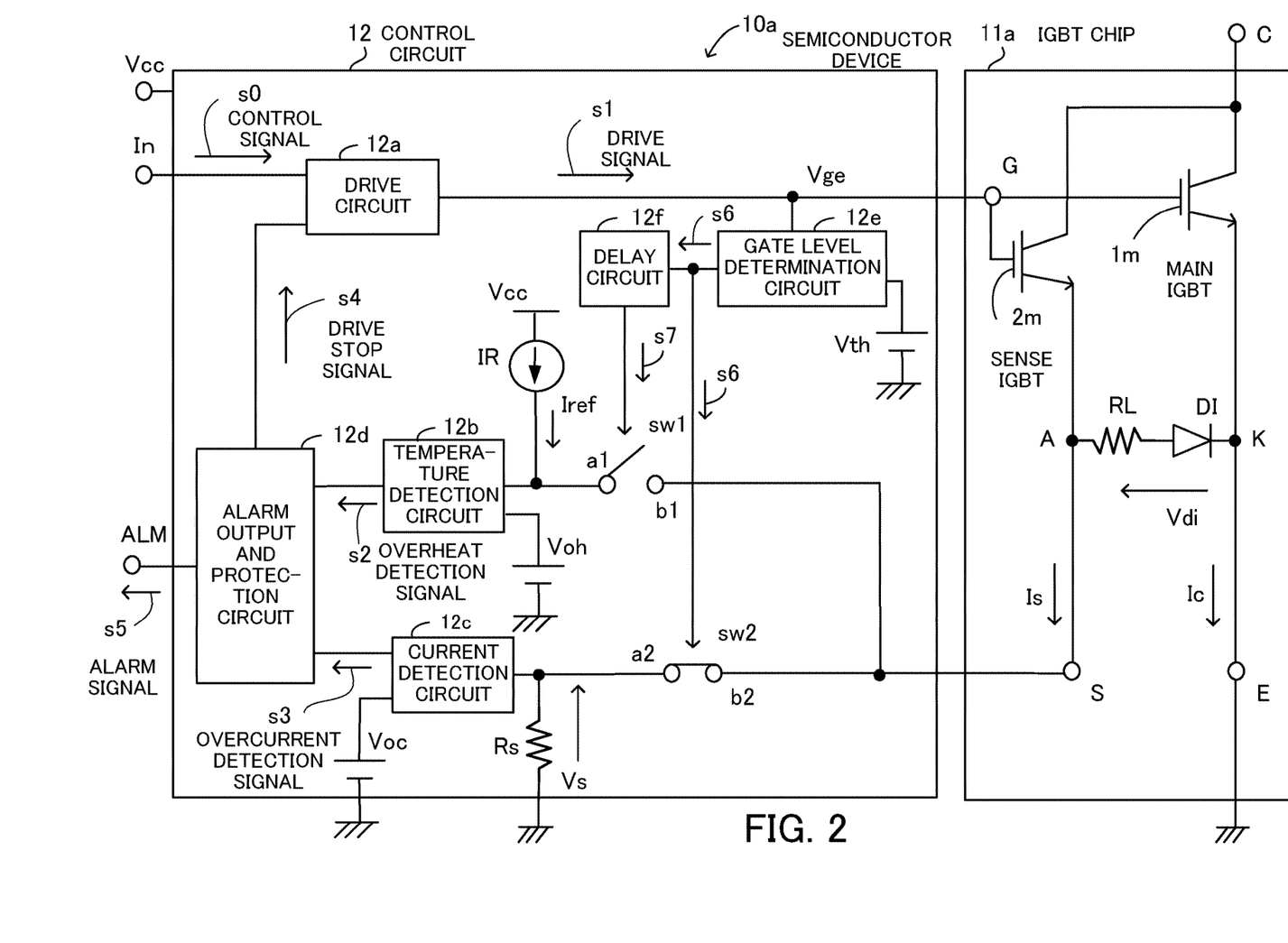
FIG. 2 illustrates an example of the configuration of a semiconductor device.

The following describes the configuration of a semiconductor device of the present embodiment in more detail. FIG. 2 illustrates an example of the configuration of a semiconductor device. The semiconductor device 10a is applied to an intelligent power module (IPM), for example, and includes an IGBT chip 11a and a control circuit 12.

The IGBT chip 11a includes a main IGBT 1m, a sense IGBT 2m, a temperature detection diode DI, and a resistor RL. The control circuit 12 includes a drive circuit 12a, a temperature detection circuit 12b, a current detection circuit 12c, an alarm output and protection circuit 12d, a gate level determination circuit 12e, a delay circuit 12f, a switch sw1 (first switch), a switch sw2 (second switch), a constant current source IR, and a sense resistor Rs.

In addition, the IGBT chip 11a has a collector electrode pad C, a gate electrode pad G, an emitter electrode pad E, and a sense emitter electrode pad S as electrode pads.

The collector electrode pad C is connected to the collector of the main IGBT 1m and the collector of the sense IGBT 2m. The gate electrode pad G is connected to the gate of the main IGBT 1m, the gate of the sense IGBT 2m, the output terminal of the drive circuit 12a, and the input terminal of the gate level determination circuit 12e.

The emitter electrode pad E is connected to the emitter of the main IGBT 1m, the cathode (K) of the temperature detection diode DI, and GND. In this connection, a load, not illustrated, is connectable between the emitter of the main IGBT 1m and GND.

The sense emitter electrode pad S is connected to the sense emitter of the sense IGBT 2m, one terminal (A) of the resistor RL, one terminal b1 of the switch sw1, and one terminal b2 of the switch sw2. In addition, the anode of the temperature detection diode DI is connected to the other terminal of the resistor RL.

In the control circuit 12, the drive circuit 12a generates a drive signal s1 for turning on or off the main IGBT 1m, according to a control signal s0 received from, for example, a microcomputer via an input terminal In, and outputs the drive signal s1 to the main IGBT 1m to cause the main IGBT 1m to perform switching (turn on or off). When the drive signal s1 is H level, the main IGBT 1m is turned on. When the drive signal s1 is L level, the main IGBT 1m is turned off.

The gate level determination circuit 12e determines whether the level of the gate voltage Vge (the voltage level of the drive signal s1) of the main IGBT 1m is H level or L level. When determining that the level of the gate voltage Vge is L level, the gate level determination circuit 12e outputs an L-level determination signal s6 (first determination signal), for example. When determining that the level of the gate voltage Vge is H level, the gate level determination circuit 12e outputs an H-level determination signal s6 (second determination signal), for example.

The delay circuit 12f outputs a delayed determination signal s7 (first delayed determination signal or second delayed determination signal) obtained by delaying the determination signal s6 output from the gate level determination circuit 12e by a predetermined period of time. The constant current source IR is applied with a voltage Vcc by a power supply terminal, and outputs a current Iref.

As to the switches sw1 and sw2, a terminal a1 (a first terminal of the switch sw1) of the switch sw1 is connected to an input terminal of the temperature detection circuit 12b and the output terminal of the constant current source IR, and a terminal a2 (a first terminal of the switch sw2) of the switch sw2 is connected to an input terminal of the current detection circuit 12c and one terminal of the sense resistor Rs. The other terminal of the sense resistor Rs is connected to GND. The terminal b1 (a second terminal of the switch sw1) of the switch sw1 and the terminal b2 (a second terminal of the switch sw2) of the switch sw2 are connected to the sense emitter electrode pad S.

In addition, the on-off switching of the switch sw1 is controlled with the delayed determination signal s7 output from the delay circuit 12f, and the on-off switching of the switch sw2 is controlled with the determination signal s6 output from the gate level determination circuit 12e.

(Switching Operation)

Figure 3:
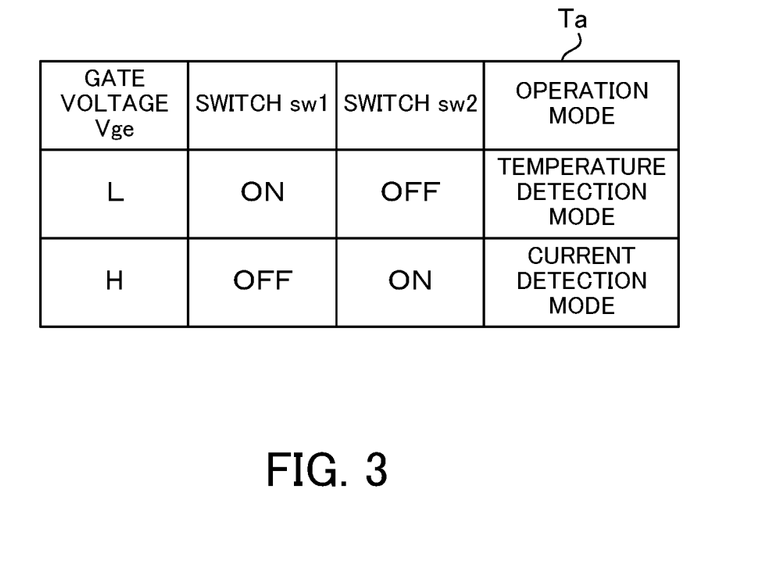
FIG. 3 is a view for describing switching operations of switches.

FIG. 3 is a view for describing switching operations of switches. The table Ta represents the correspondence relationship between a gate voltage Vge, switching states of the switches sw1 and sw2, and an operation mode.

(L-level gate voltage Vge) The main IGBT 1m is in OFF state. For example, the gate level determination circuit 12e outputs an L-level determination signal s6 (first determination signal). At this time, the switch sw1 is turned on upon receipt of an L-level delayed determination signal s7 (first delayed determination signal) output from the delay circuit 12f, and the switch sw2 is turned off upon receipt of the L-level determination signal s6 output from the gate level determination circuit 12e, so that the control circuit 12 goes into a temperature detection mode.

(H-level gate voltage Vge) The main IGBT 1m is in ON state. For example, the gate level determination circuit 12e outputs an H-level determination signal s6 (second determination signal). At this time, the switch sw1 is turned off upon receipt of an H-level delayed determination signal s7 (second delayed determination signal) output from the delay circuit 12f, and the switch sw2 is turned on upon receipt of the H-level determination signal s6 output from the gate level determination circuit 12e, so that the control circuit 12 goes into a current detection mode.

(Temperature Detection Mode)

In the temperature detection mode, the switch sw1 is in ON state and the switch sw2 is in OFF state, as described above. In this case, the current Iref output from the constant current source IR flows into the temperature detection diode DI via the sense emitter electrode pad S, and a potential that is generated in the temperature detection diode DI at this time is supplied to the temperature detection circuit 12b as a temperature detection voltage Vdi indicating the temperature state of the main IGBT 1m.

The temperature detection circuit 12b compares the temperature detection voltage Vdi with a temperature reference voltage Voh, and when detecting based on the comparison result that the temperature state of the main IGBT 1*m* is an overheat state, outputs an overheat detection signal s2.

Figure 4:
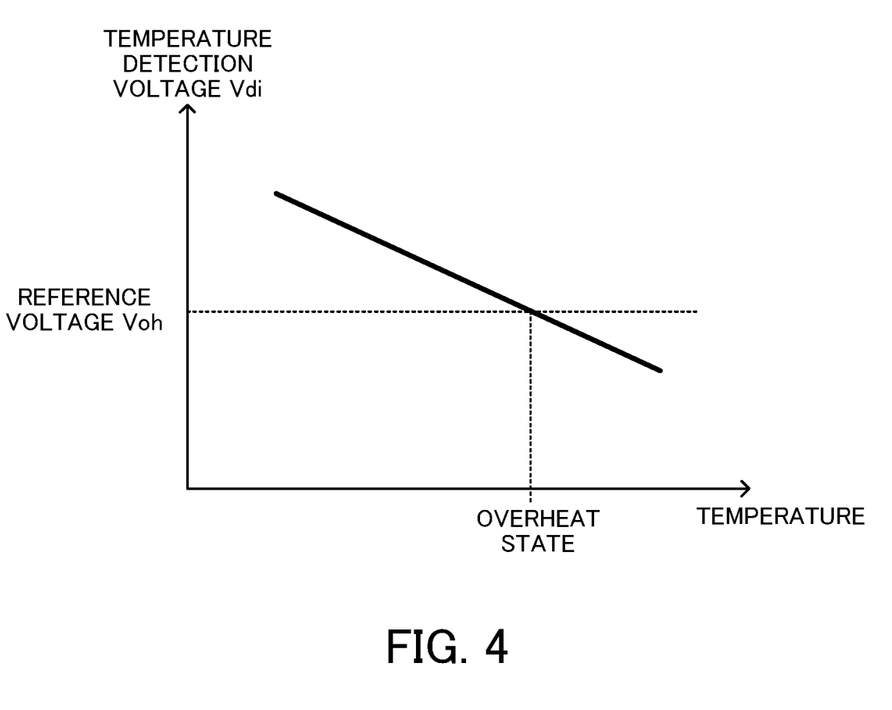
FIG. 4 illustrates temperature characteristics of a temperature detection diode.

FIG. 4 illustrates temperature characteristics of a temperature detection diode. The vertical axis represents the temperature detection voltage Vdi, whereas the horizontal axis represents temperature. The temperature detection diode DI has the following negative temperature characteristics: the temperature detection voltage Vdi decreases as the temperature increases.

More specifically, the temperature detection voltage Vdi (forward voltage) at the anode of the temperature detection diode DI, based on the current Iref flowing from the constant current source IR to the temperature diode DI1, decreases as the temperature increases. Therefore, when the temperature detection voltage Vdi falls to the temperature reference voltage Voh or lower, the temperature detection circuit 12*b* detects that the temperature state of the main IGBT 1*m* is an overheat state.

(Current Detection Mode)

In the current detection mode, the switch sw1 is in OFF state, and the switch sw2 is in ON state, as described above. In this case, the sense current Is output from the sense emitter of the sense IGBT 2*m* flows via the sense emitter electrode pad S to the current detection circuit 12*c*. In addition, one terminal of the sense resistor Rs is connected to the terminal a2 of the switch sw2 and an input terminal of the current detection circuit 12*c*, and the other terminal of the sense resistor Rs is connected to GND. Therefore, a potential that is generated by the sense current Is flowing through the sense resistor Rs is supplied as a sense voltage Vs to the current detection circuit 12*c*.

The current detection circuit 12*c* compares the sense voltage Vs with a current reference voltage Voc, and when detecting based on the comparison result that the current state of the main IGBT 1*m* is an overcurrent state, outputs an overcurrent detection signal s3.

In this connection, the resistor RL is a current limiting element and has a function serving as a current limiting resistor that prevents the sense current Is from being diverted to the temperature detection diode DI. The resistance value of the resistor RL is higher than the resistance value of the sense resistor Rs (RL>>Rs). Therefore, the resistor RL is able to prevent the sense current Is from being diverted to the temperature detection diode DI in the current detection mode, which makes it possible to prevent a decrease in the accuracy of current detection.

(Alarm Output and Protection)

When receiving at least one of the overheat detection signal s2 and the overcurrent detection signal s3, the alarm output and protection circuit 12*d* outputs an alarm signal s5 via an output terminal ALM. In addition, when receiving at least one of the overheat detection signal s2 and overcurrent detection signal s3, the alarm output and protection circuit 12*d* outputs a drive stop signal s4 to the drive circuit 12*a*. In response to the drive stop signal s4, the drive circuit 12*a* turns off the main IGBT 1*m* to stop the operation of the main IGBT 1*m*.

(Operation Time Chart)

Figure 5:
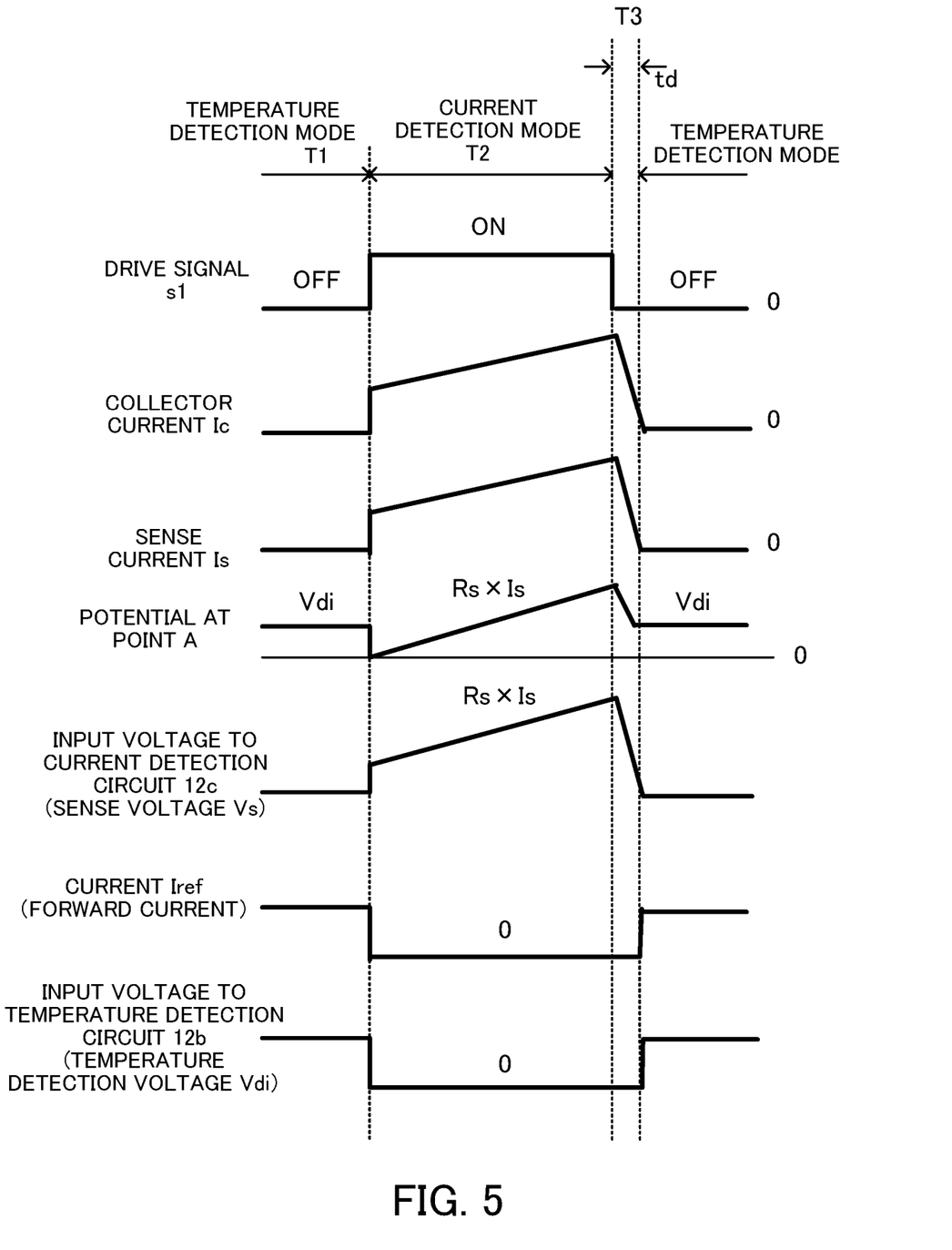
FIG. 5 is a time chart representing the operation of the semiconductor device.

FIG. 5 is a time chart representing the operation of the semiconductor device.

(Time period T1) When the switch sw1 is turned on and the switch sw2 is turned off, the control circuit 12 goes into the temperature detection mode. The drive signal s1 is L level, and therefore the main IGBT 1*m* is turned off. Since the main IGBT 1*m* is in OFF state, the collector current Ic and sense current Is do not flow.

In addition, the current Iref from the constant current source IR flows via the switch sw1, sense emitter electrode pad S, and resistor RL to the anode of the temperature detection diode DI.

The current Iref is a forward current in the temperature detection diode DI. Therefore, a forward voltage that is a voltage drop caused across the temperature detection diode DI by the forward current is usable as a temperature detection voltage Vdi indicating the temperature state of the main IGBT 1*m*, and thus the potential at the point A in FIG. 2 is the temperature detection voltage Vdi.

Therefore, an input voltage to the temperature detection circuit 12*b* is the temperature detection voltage Vdi as well. In addition, since the switch sw2 is in OFF state, an input voltage to the current detection circuit 12*c* is 0 V.

(Time period T2) When the switch sw1 is turned off and the switch sw2 is turned on, the control circuit 12 goes into the current detection mode. Since the drive signal s1 is H level, the main IGBT 1*m* is turned on.

Since the main IGBT 1*m* is in ON state, the collector current IC flows and increases, and the sense current Is that is proportional to the collector current Ic flows and increases accordingly.

Since the switch sw1 is in OFF state, the current Iref from the constant current source IR does not flow as a forward current in the temperature detection diode DI. In addition, since the switch sw2 is in ON state, the potential at the point A is Rs×Is, where Rs denotes the resistance value of the sense resistor Rs. The potential at the point A increases as the sense current Is increases. Therefore, the input voltage to the current detection circuit 12*c* is a sense voltage Vs (=Rs×Is) as well. In addition, the input voltage to the temperature detection circuit 12*b* is 0 V.

(Time period T3) The time period T3 is equal to a delay time td set in the delay circuit 12*f*. It is so controlled that the current detection mode is switched to the temperature detection mode after a passage of the delay time td.

This is because, if the current detection mode is switched to the temperature detection mode before the sense voltage Vs generated in the current detection mode is discharged, a residual voltage of the sense voltage Vs is input to the temperature detection circuit 12*b*, which may prevent the temperature detection circuit 12*b* from detecting the temperature with high accuracy.

For this reason, in the present embodiment, it is so controlled as to switch from the current detection mode to the temperature detection mode after the passage of the predetermined delay time td from the end of the current detection mode. This makes it possible to prevent the residual voltage of the sense voltage Vs from being input to the temperature detection circuit 12*b* and thus to prevent a decrease in the accuracy of the temperature detection circuit 12*b*.

Figure 6:
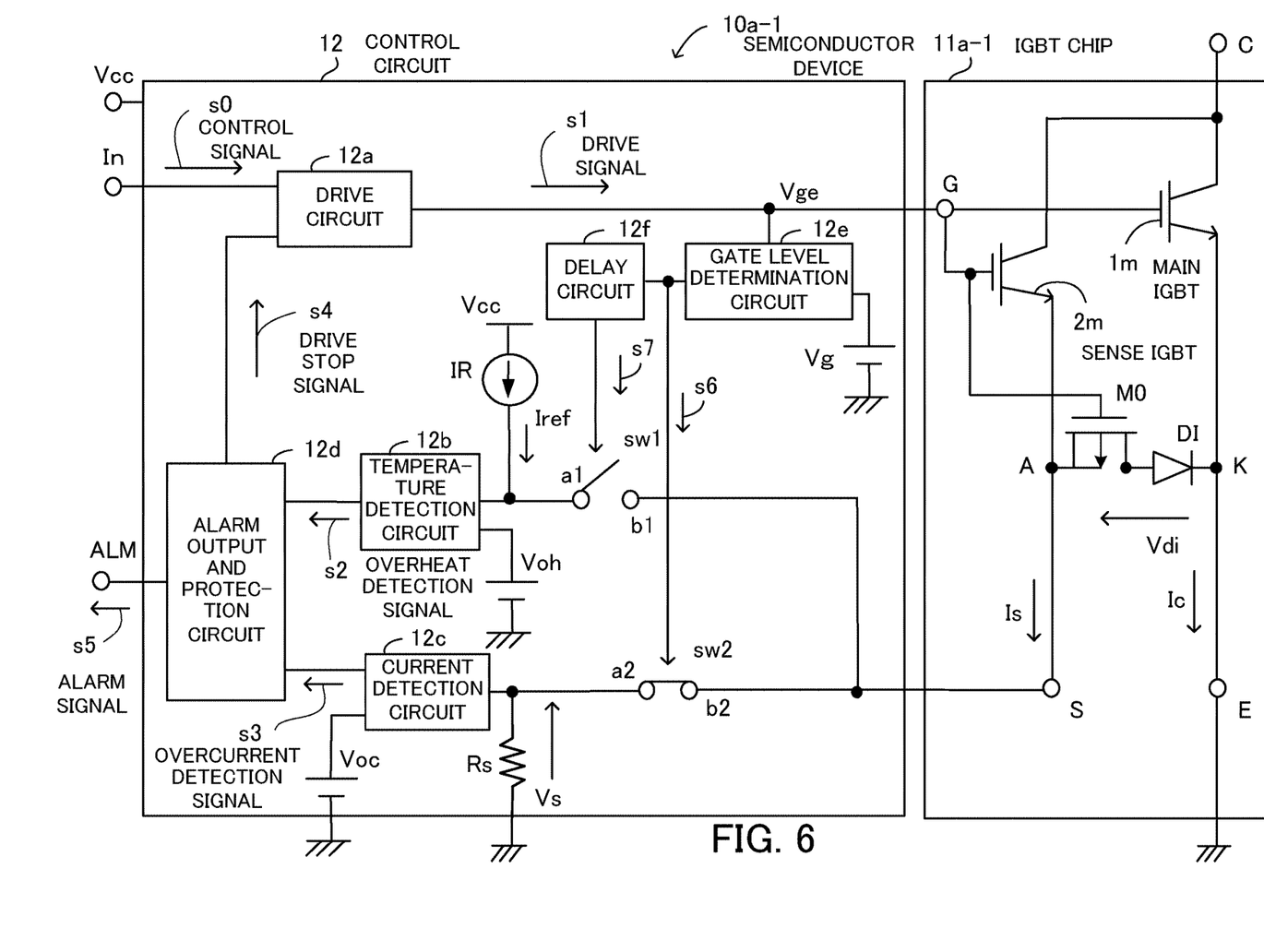
FIG. 6 illustrates an example of the configuration of a semiconductor device.

FIG. 6 illustrates an example of the configuration of a semiconductor device. The semiconductor device 10*a*-1 includes an IGBT chip 11*a*-1 and a control circuit 12 as a variation of FIG. 2. The IGBT chip 11*a*-1 includes a main IGBT 1*m*, a sense IGBT 2*m*, and a temperature detection diode DI. In addition, the IGBT chip 11*a*-1 includes a P-channel metal-oxide-semiconductor (PMOS) transistor MO as a MOS transistor.

The above-described semiconductor device 10*a* of FIG. 2 includes the resistor RL as a current limiting element. The semiconductor device 10*a*-1 of FIG. 6 includes the PMOS transistor MO as a current limiting element, and the other configuration thereof is the same as that of FIG. 2.

The gate of the PMOS transistor MO is connected to the gate of the sense IGBT 2m, the gate of the main IGBT 1m, the gate electrode pad G, the output terminal of the drive circuit 12a, and the output terminal of the gate level determination circuit 12e. The source of the PMOS transistor MO is connected to the sense emitter of the sense IGBT 2m, the sense emitter electrode pad S, the terminal b1 of the switch sw1, and the terminal b2 of the switch sw2. The drain of the PMOS transistor MO is connected to the anode of the temperature detection diode DI.

The PMOS transistor MO has a function serving as a current limiting semiconductor element that prevents the sense current Is from being diverted to the temperature detection diode DI. In the current detection mode, the gate voltage Vge is H level, and at this time the PMOS transistor MO is turned off. In the temperature detection mode, the gate voltage Vge is L level, and at this time the PMOS transistor MO is turned on.

Therefore, in the current detection mode, the PMOS transistor MO is in OFF state. This makes it possible to prevent the sense current Is from being diverted to the temperature detection diode DI and thus to prevent a decrease in the accuracy of the current detection.

Figure 7:
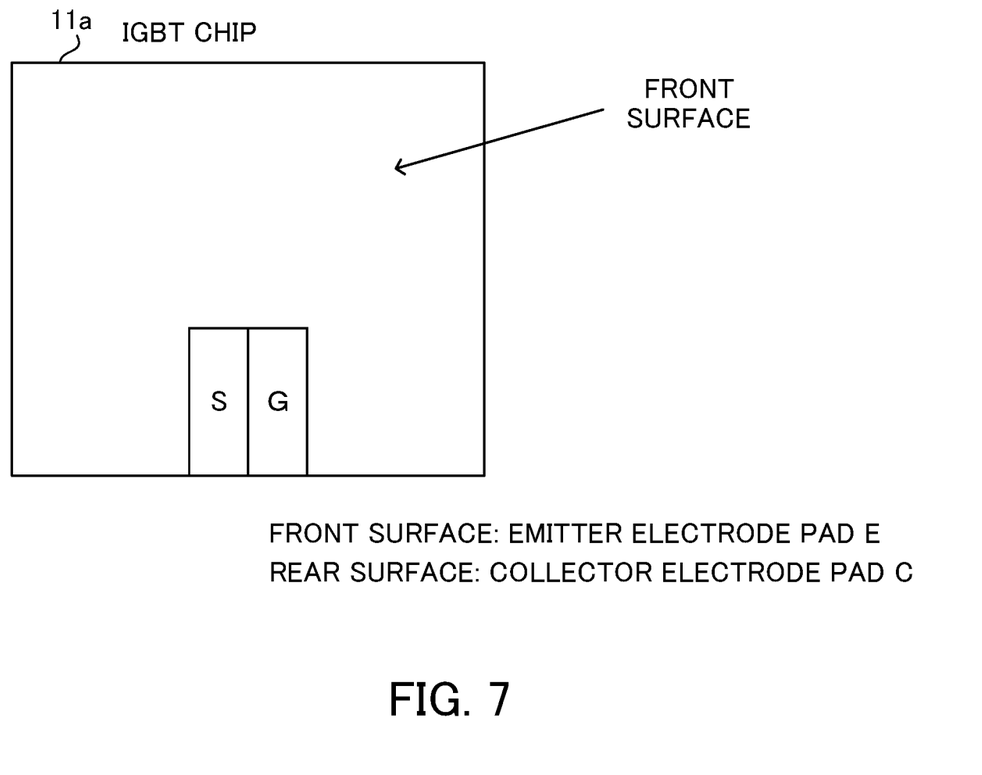
FIG. 7 illustrates electrode pads provided on an insulated gate bipolar transistor (IGBT) chip.

FIG. 7 illustrates electrode pads provided on an IGBT chip. In the IGBT chip 11a of the semiconductor device 10a, the emitter electrode pad E is formed on the front surface of the IGBT chip 11a, and the collector electrode pad C is formed on the rear surface of the IGBT chip 11a. In addition, the sense emitter electrode pad S and gate electrode pad G are formed on the front surface of the IGBT chip 11a.

As described earlier, in the semiconductor device 10a configured as illustrated in FIG. 2, an anode electrode pad A, which is conventionally provided, is combined into the sense emitter electrode pad S, and a cathode electrode pad K, which is conventionally provided, is combined into the emitter electrode pad E. That is, the anode electrode pad A and cathode electrode pad K are eliminated. The IGBT chip 11a-1 of the semiconductor device 10a-1 of FIG. 6 has the same electrode pad configuration.

Therefore, in the semiconductor devices 10a and 10a-1, two electrode pads are eliminated, as compared with the conventional configuration. Thus, it is possible to simplify the chip manufacturing process, reduce the chip size, and also reduce the number of wires in wire bonding.

(Configuration of Semiconductor Device (with Elimination of One Electrode Pad))

Figure 8:
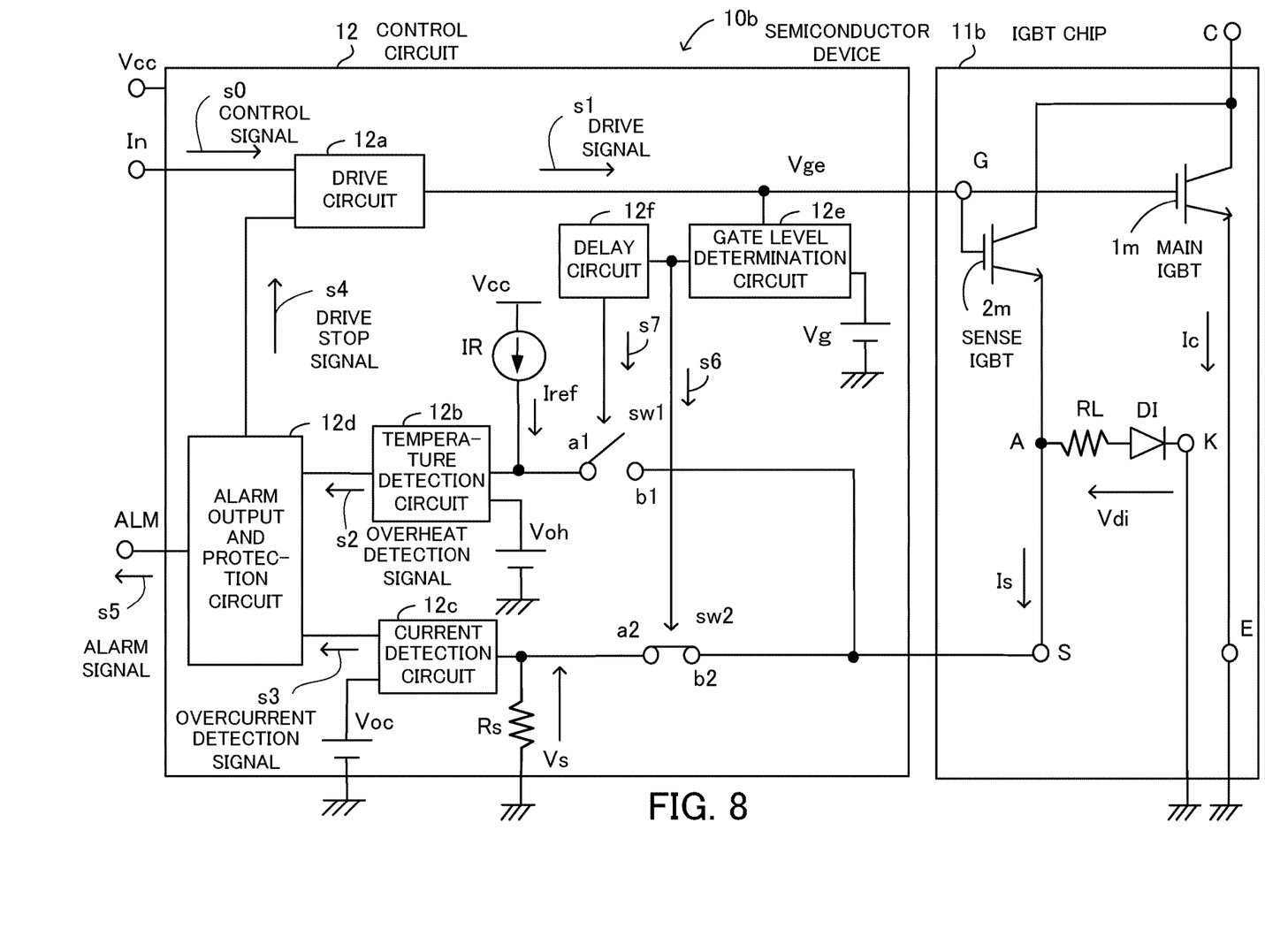
FIG. 8 illustrates an example of the configuration of a semiconductor device.

FIG. 8 illustrates an example of the configuration of a semiconductor device. The semiconductor device 10b includes an IGBT chip 11b and a control circuit 12. The IGBT chip 11b includes a main IGBT 1m, a sense IGBT 2m, a temperature detection diode DI, and a resistor RL. The control circuit 12 has the same configuration as that of FIG. 2.

In addition, the IGBT chip 11b has a collector electrode pad C, a gate electrode pad G, an emitter electrode pad E, a cathode electrode pad K, and a sense emitter electrode pad S as electrode pads.

The collector electrode pad C is connected to the collector of the main IGBT 1m and the collector of the sense IGBT 2m. The gate electrode pad G is connected to the gate of the main IGBT 1m, the gate of the sense IGBT 2m, the output terminal of the drive circuit 12a, and the input terminal of the gate level determination circuit 12e. The emitter electrode pad E is connected to the emitter of the main IGBT 1m and GND.

The cathode electrode pad K is connected to GND. The sense emitter electrode pad S is connected to the sense emitter of the sense IGBT 2m, one terminal (A) of the resistor RL, the terminal b1 of the switch sw1, and the terminal b2 of the switch sw2. In this connection, the anode of the temperature detection diode DI is connected to the other terminal of the resistor RL.

Here, in the case of a configuration in which the cathode electrode pad K and the emitter electrode pad E are connected, as in the semiconductor device 10a described above with reference to FIG. 2, the emitter of the main IGBT 1m through which a large current flows is taken as a base. Therefore, a voltage drop caused by wiring resistance is added to a voltage drop of the temperature detection diode DI, which may cause malfunction.

For this reason, in the semiconductor device 10b, the cathode electrode pad K and the emitter electrode pad E are not combined, but the sense emitter electrode pad S and the anode electrode pad A are combined. This configuration makes it possible to prevent malfunction in detecting a temperature based on a current flowing through the emitter of the main IGBT 1m, and also to reduce the number of electrode pads by one.

Figure 9:
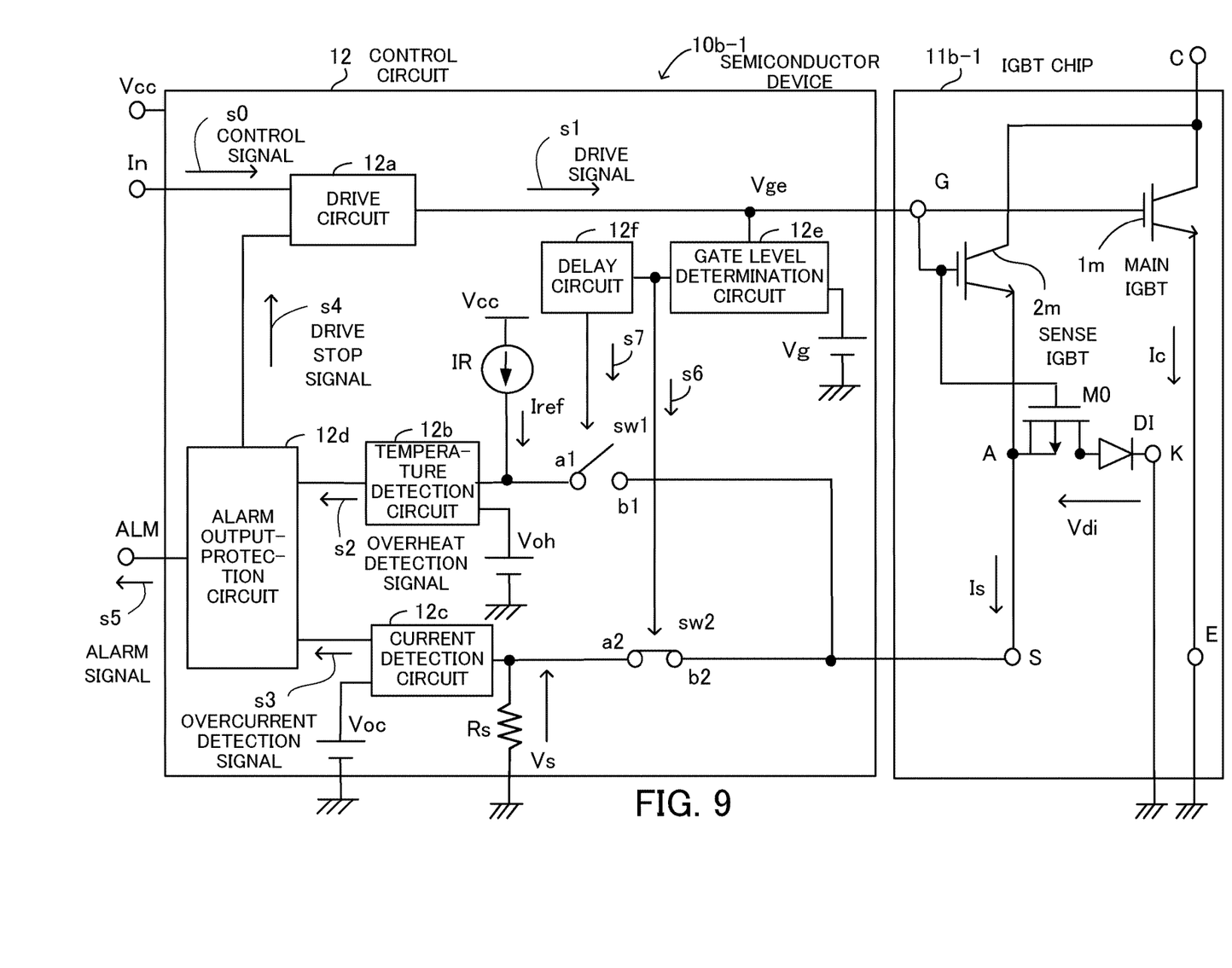
FIG. 9 illustrates an example of the configuration of a semiconductor device.

FIG. 9 illustrates an example of the configuration of a semiconductor device. The semiconductor device 10b-1 includes an IGBT chip 11b-1 and a control circuit 12 as a variation of FIG. 8. The IGBT chip 11b-1 includes a main IGBT 1m, a sense IGBT 2m, a temperature detection diode DI, and a PMOS transistor MO. The above-described semiconductor device 10b of FIG. 8 includes the resistor RL as a current limiting element, whereas the semiconductor device 10b-1 of FIG. 9 includes the PMOS transistor MO as a current limiting element. The other configuration thereof is the same as that of FIG. 8.

The gate of the PMOS transistor MO is connected to the gate of the sense IGBT 2m, the gate of the main IGBT 1m, the gate electrode pad G, the output terminal of the drive circuit 12a, and the output terminal of the gate level determination circuit 12e.

The source of the PMOS transistor MO is connected to the sense emitter of the sense IGBT 2m, the sense emitter electrode pad S, the terminal b1 of the switch sw1, and the terminal b2 of the switch sw2. The drain of the PMOS transistor MO is connected to the anode of the temperature detection diode DI.

Here, in the current detection mode, the gate voltage Vge is H level, and at this time the PMOS transistor MO is turned off. In the temperature detection mode, the gate voltage Vge is L level, and at this time the PMOS transistor MO is turned on.

Therefore, in the current detection mode, the PMOS transistor MO is in OFF state, which makes it possible to prevent the sense current Is from being diverted to the temperature detection diode DI and thus to prevent a decrease in the accuracy of current detection.

Figure 10:
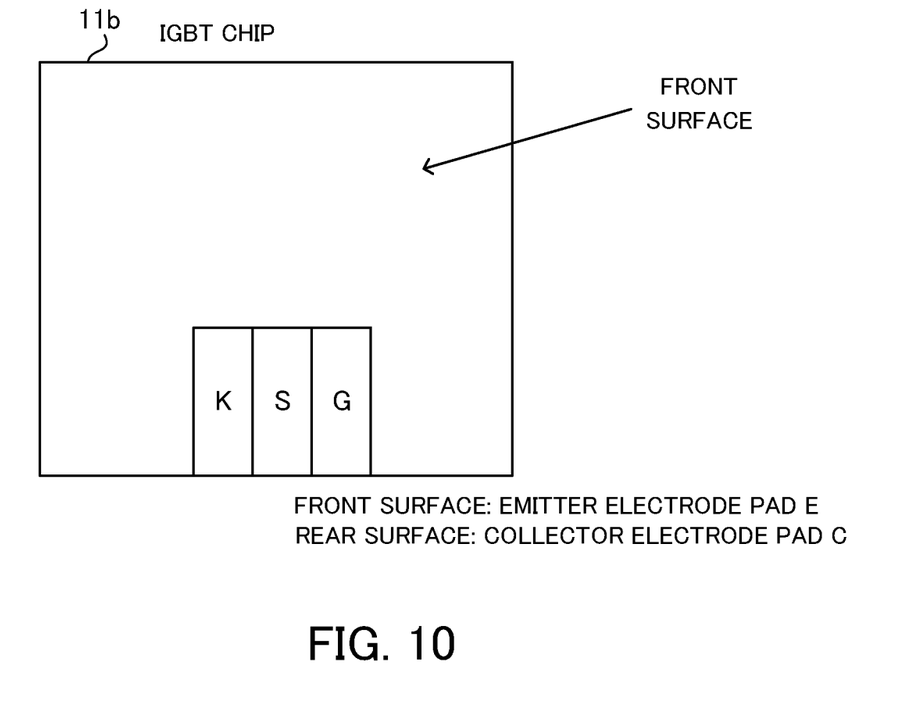
FIG. 10 illustrates electrode pads provided on an IGBT chip.

FIG. 10 illustrates electrode pads provided on an IGBT chip. In the IGBT chip 11b of the semiconductor device 10b, the emitter electrode pad E is formed on the front surface of the IGBT chip 11b, and the collector electrode pad C is formed on the rear surface of the IGBT chip 11b. In addition, the cathode electrode pad K, sense emitter electrode pad S, and gate electrode pad G are formed on the front surface of the IGBT chip 11b.

As described above, in the semiconductor device 10b configured as illustrated in FIG. 8, an anode electrode pad A, which is conventionally provided, is combined into the sense emitter electrode pad S. That is, the anode electrode pad A is eliminated. The IGBT chip 11b-1 of the semiconductor device 10b-1 of FIG. 9 has the same electrode pad configuration.

Therefore, in the semiconductor devices 10b and 10b-1, the number of electrode pads is reduced by one, as compared with the conventional configuration. This makes it possible to simplify the chip manufacturing process, reduce the chip size, and reduce the number of wires in wire bonding.

As described above, in the semiconductor device of the present embodiment, the control circuit detects the turn-on and turn-off of the main IGBT and switches between the temperature detection mode and the current detection mode. With this approach, it is possible to configure a semiconductor chip such that the sense emitter electrode pad S is also usable in common for the node A corresponding to the anode electrode pad and the cathode electrode pad K and the emitter electrode pad E are combined. Since the number of electrode pads is reduced, it is possible to simplify the chip manufacturing process, reduce the chip size, and reduce the number of wires in wire bonding.

Heretofore, the embodiment has been described. Each component in the embodiment may be replaced with another component having an equivalent function. In addition, other desired configurations and steps may be added. In addition, two or more desired configurations (features) in the embodiment described above may be combined.

According to one aspect, it is possible to reduce the number of electrode pads that are formed on a semiconductor chip.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device for operating a load, comprising:
  a semiconductor chip, including
    an output element that receives a drive signal, to thereby perform switching to operate the load, the output element having a gate and an emitter,
    a current monitor element that monitors a current flowing through the output element, the current monitor element having a gate and a sense emitter, and
    a temperature detection element that detects a temperature of the output element, the temperature detection element having an anode and a cathode,
  the semiconductor chip further having:
    a first electrode pad connected to the gate of the output element and the gate of the current monitor element,
    a second electrode pad connected to the sense emitter of the current monitor element and to the anode of the temperature detection element via a current limiting element, and
    a third electrode pad connected to the cathode of the temperature detection element, which is grounded without being connected to the emitter of the output element; and
  a control circuit connected to the first electrode pad and the second electrode pad, the control circuit being configured to
    input the drive signal to the gate of the output element via the first electrode pad,
    operate in a temperature detection mode in response to the output element being turned off, the temperature detection mode being a mode in which the control circuit
      receives a temperature detection voltage output from the temperature detection element via the second electrode pad, and
      detects a temperature state of the output element, and
    operate in a current detection mode in response to the output element being turned on, the current detection mode being a mode in which the control circuit
      receives a sense current output from the current monitor element via the second electrode pad, and
      detects a current state of the output element.

2. The semiconductor device according to claim 1, wherein
  the control circuit includes a drive circuit, a gate level determination circuit, and a delay circuit,
  the drive circuit generates the drive signal for turning on or off the output element,
  the gate level determination circuit determines, based on a voltage level of the generated drive signal, whether the output element is on or off, to thereby output a determination signal, and
  the delay circuit outputs a delayed determination signal obtained by delaying the determination signal by a predetermined period of time.

3. The semiconductor device according to claim 2, wherein
  the control circuit further includes
    a first switch having a first terminal and a second terminal thereof,
    a second switch having a first terminal and a second terminal thereof,
    a constant current source having an output terminal,
    a sense resistor having a first terminal and a second terminal thereof,
    a temperature detection circuit having an input terminal thereof, and
    a current detection circuit having an input terminal thereof, wherein
  the constant current source outputs a forward current to the temperature detection element,
  the sense resistor converts the sense current to a sense voltage,
  the first terminal of the first switch is connected to the output terminal of the constant current source and the input terminal of the temperature detection circuit,
  the first terminal of the second switch is connected to the first terminal of the sense resistor and the input terminal of the current detection circuit, and
  the second terminal of the first switch is connected to the second terminal of the second switch and the second electrode pad.

4. The semiconductor device according to claim 3, wherein
  the control circuit switches to the temperature detection mode in response to the gate level determination circuit detecting a turn-off of the output element and outputting a first determination signal and the delay circuit delaying the first determination signal by the predetermined period of time and outputting a first delayed determination signal, the first switch is turned on in response to the first delayed determination signal, so as to connect the output terminal of the constant current source and the input terminal of the temperature detection circuit to the second electrode pad, and the second switch is turned off in response to the first determination signal, so as to disconnect the first terminal of the sense resistor and the input terminal of the current detection circuit from the second electrode pad.

5. The semiconductor device according to claim 4, wherein the temperature detection circuit is configured to receive the temperature detection voltage from the temperature detection element via the second electrode pad, compare the temperature detection voltage with a temperature reference voltage, and output an overheat detection signal upon detecting, based on a result of the comparison, that the temperature state of the output element is an overheat state.

6. The semiconductor device according to claim 3, wherein the control circuit switches to the current detection mode in response to the gate level determination circuit detecting a turn-on of the output element and outputting a second determination signal and the delay circuit delaying the second determination signal by the predetermined period of time and outputting a second delayed determination signal, the first switch is turned off in response to the second delayed determination signal, so as to disconnect the output terminal of the constant current source and the input terminal of the temperature detection circuit from the second electrode pad, and the second switch is turned on in response to the second determination signal, so as to connect the first terminal of the sense resistor and the input terminal of the current detection circuit to the second electrode pad.

7. The semiconductor device according to claim 6, wherein the sense current from the current monitor element flows via the second electrode pad, and the current detection circuit compares the sense voltage, obtained by the sense resistor converting the sense current, with a current reference voltage, and outputs an overcurrent detection signal upon detecting, based on a result of the comparison, that the current state of the output element is an overcurrent state.

8. The semiconductor device according to claim 2, wherein the control circuit further includes an alarm output and protection circuit that outputs an alarm signal in response to at least one of an overheat state and an overcurrent state of the output element being detected, and the drive circuit stops an operation of the output element in response to the alarm signal being output.

9. The semiconductor device according to claim 1, wherein the current limiting element between the anode of the temperature detection element and the sense emitter of the current monitor element is a resistor.

10. The semiconductor device according to claim 1, wherein the current limiting element between the anode of the temperature detection element and the sense emitter of the current monitor element is a metal-oxide-semiconductor (MOS) transistor.

11. The semiconductor device according to claim 1, wherein the temperature detection element is a diode.

12. A semiconductor device for operating a load, comprising:

a semiconductor chip, including an output element that receives a drive signal, to thereby perform switching to operate the load, the output element having a gate and an emitter, a current monitor element that monitors a current flowing through the output element, the current monitor element having a gate and a sense emitter, and a temperature detection element that detects a temperature of the output element, the temperature detection element having an anode and a cathode, the cathode being connected to the emitter of the output element, the semiconductor chip further having:

a first electrode pad connected to the gate of the output element and the gate of the current monitor element, and a second electrode pad connected to the sense emitter of the current monitor element and to the anode of the temperature detection element via a current limiting element; and a control circuit connected to the first electrode pad and the second electrode pad, the control circuit being configured to input the drive signal to the gate of the output element via the first electrode pad, operate in a temperature detection mode in response to the output element being turned off, the temperature detection mode being a mode in which the control circuit receives a temperature detection voltage output from the temperature detection element via the second electrode pad, and detects a temperature state of the output element, and operate in a current detection mode in response to the output element being turned on, the current detection mode being a mode in which the control circuit receives a sense current output from the current monitor element via the second electrode pad, and detects a current state of the output element.

* * * * *